(12) United States Patent
Maekawa et al.

(10) Patent No.: US 11,495,432 B2
(45) Date of Patent: Nov. 8, 2022

(54) CHARGED PARTICLE BEAM DEVICE AND METHOD FOR CONTROLLING SAMPLE STAGE

(71) Applicant: JEOL Ltd., Tokyo (JP)

(72) Inventors: Daichi Maekawa, Tokyo (JP); Hitoshi Sakurai, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 17/381,598

(22) Filed: Jul. 21, 2021

(65) Prior Publication Data

US 2022/0037110 A1   Feb. 3, 2022

(30) Foreign Application Priority Data

Jul. 28, 2020   (JP) .............................. JP2020-127374

(51) Int. Cl.
*H01J 37/26* (2006.01)
*H01J 37/147* (2006.01)
(Continued)

(52) U.S. Cl.
CPC .......... *H01J 37/265* (2013.01); *H01J 37/147* (2013.01); *H01J 37/20* (2013.01); *H01J 37/222* (2013.01); *H01J 37/244* (2013.01)

(58) Field of Classification Search
CPC .......... H01J 37/00; H01J 37/02; H01J 37/023; H01J 37/265; H01J 37/147; H01J 37/1472;
(Continued)

(56) References Cited

U.S. PATENT DOCUMENTS

2008/0237462 A1* 10/2008 Ando .................... G01N 23/225
250/311
2011/0133066 A1* 6/2011 Nozoe ..................... H01L 22/12
250/252.1
(Continued)

FOREIGN PATENT DOCUMENTS

JP   2002286663 A   10/2002
JP   2014225362 A   12/2014

OTHER PUBLICATIONS

Extended European Search Report issued in EP21182460.2 dated Jan. 4, 2022.
(Continued)

*Primary Examiner* — Jason L McCormack
(74) *Attorney, Agent, or Firm* — The Webb Law Firm

(57) ABSTRACT

In a charged particle beam device, a control unit performs processing for: operating a deflector based on movement information to move a visual field of a deflector from a first visual field to a second visual field; capturing the sample image with the second visual field to obtain a reference image; operating the deflector to move the visual field from the second visual field to the first visual field; operating the sample stage based on the movement information to move the visual field from the first visual field to a third visual field; capturing the sample image with the third visual field to obtain a comparison image; calculating a positional deviation amount between the reference image and the comparison image; determining whether the positional deviation amount is equal to or less than a designated positional deviation amount; and operating the sample stage based on the positional deviation amount.

6 Claims, 12 Drawing Sheets

(51) Int. Cl.
*H01J 37/20* (2006.01)
*H01J 37/22* (2006.01)
*H01J 37/244* (2006.01)

(58) Field of Classification Search
CPC ........ H01J 37/1474; H01J 37/22; H01J 37/20; H01J 37/222; H01J 37/244; H01J 2237/1501; H01J 2237/20221; H01J 2237/221
USPC .......................................... 250/306, 307, 311
See application file for complete search history.

(56) References Cited

U.S. PATENT DOCUMENTS

2019/0369035 A1* 12/2019 Tsuchiya ............... G03F 7/7065
2020/0111219 A1 4/2020 Potocek et al.

OTHER PUBLICATIONS

Raith Software Reference Manual, Version 5.0, Document No. 07-3-9911-SW-1.07, Mar. 20, 2007, pp. 1-202.
Office Action issued in JP2020127374 dated Jun. 28, 2022.

\* cited by examiner

CHARGED PARTICLE BEAM DEVICE AND METHOD FOR CONTROLLING SAMPLE STAGE

CROSS-REFERENCE TO RELATED APPLICATION

This application claims priority to Japanese Patent Application No. 2020-127374 filed Jul. 28, 2020, the disclosure of which is hereby incorporated by reference in its entirety.

BACKGROUND OF THE INVENTION

Field of the Invention

The present invention relates to a charged particle beam device and a method for controlling a sample stage.

Description of Related Art

In a charged particle beam device such as a transmission electron microscope and a focused ion beam system, the accuracy of movement to a target visual field is required. In a charged particle beam device, the visual field is moved by mechanically moving a sample by using a sample stage. The visual field can also be moved by electromagnetically deflecting an electron beam directed on a sample by using a deflector as disclosed, for example, in JP-A-2002-286663.

When the visual field is moved using the sample stage, it is difficult to move the visual field to the target visual field with high accuracy because the visual field is moved mechanically.

On the other hand, using the deflector, the visual field is moved electromagnetically and therefore can be moved to the target visual field highly accurately. However, when the visual field is moved using the deflector, the path of the electron beam deviates from the optical axis.

SUMMARY OF THE INVENTION

According to a first aspect of the invention, there is provided a charged particle beam device irradiating a sample with a charged particle beam to obtain a sample image, the device including:
a deflector which deflects the charged particle beam;
a sample stage which moves the sample;
a detector used for capturing the sample image; and
a control unit which controls the deflector and the sample stage,
the control unit performing processing for:
obtaining movement information for moving a visual field of the deflector;
operating the deflector based on the movement information to move the visual field from a first visual field to a second visual field;
capturing the sample image with the second visual field to obtain a reference image;
operating the deflector to move the visual field from the second visual field to the first visual field;
operating the sample stage based on the movement information to move the visual field from the first visual field to a third visual field;
capturing the sample image with the third visual field to obtain a comparison image;
calculating a positional deviation amount between the reference image and the comparison image;
determining whether the positional deviation amount between the reference image and the comparison image is equal to or less than a designated positional deviation amount; and
operating the sample stage based on the positional deviation amount between the reference image and the comparison image to move the visual field from the third visual field to a fourth visual field when a determination is made that the positional deviation amount between the reference image and the comparison image is not equal to or less than the designated positional deviation amount.

According to a second aspect of the invention, there is provided a method for controlling a sample stage in a charged particle beam device including a deflector which deflects a charged particle beam, the sample stage which moves a sample, and a detector used for capturing a sample image, the method including:
obtaining movement information for moving a visual field of the deflector;
operating the deflector based on the movement information to move the visual field from a first visual field to a second visual field;
capturing the sample image with the second visual field to obtain a reference image;
operating the deflector to move the visual field from the second visual field to the first visual field;
operating the sample stage based on the movement information to move the visual field from the first visual filed to a third visual field;
capturing the sample image with the third visual field to obtain a comparison image;
calculating a positional deviation amount between the reference image and the comparison image;
determining whether the positional deviation amount between the reference image and the comparison image is equal to or less than a designated deviation amount; and
operating the sample stage based on the positional deviation amount between the reference image and the comparison image to move the visual field from the third visual field to a fourth visual field when a determination is made that the positional deviation amount between the reference image and the comparison image is not equal to or less than a designated positional deviation amount.

DESCRIPTION OF THE INVENTION

Figure 1:
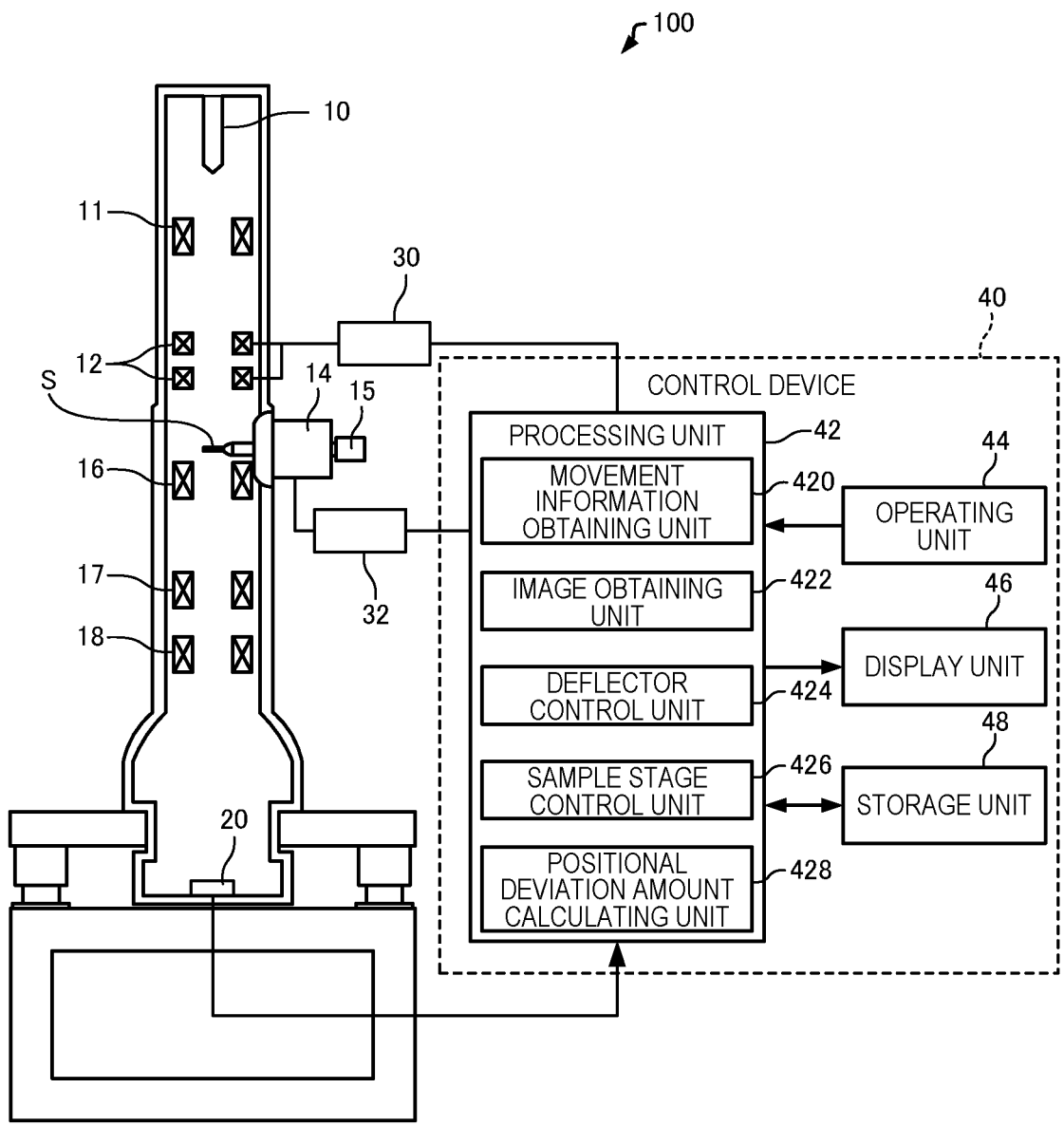
FIG. 1 is a diagram illustrating a configuration of a transmission electron microscope according to an embodiment of the invention.

According to an embodiment of the invention, there is provided a charged particle beam device irradiating a sample with a charged particle beam to obtain a sample image, the device including:

a deflector which deflects the charged particle beam;

a sample stage which moves the sample;

a detector used for capturing the sample image; and a control unit which controls the deflector and the sample stage, the control unit performing processing for:

obtaining movement information for moving a visual field of the deflector;

operating the deflector based on the movement information to move the visual field from a first visual field to a second visual field;

capturing the sample image with the second visual field to obtain a reference image;

operating the deflector to move the visual field from the second visual field to the first visual field;

operating the sample stage based on the movement information to move the visual field from the first visual field to a third visual field;

capturing the sample image with the third visual field to obtain a comparison image;

calculating a positional deviation amount between the reference image and the comparison image;

determining whether the positional deviation amount between the reference image and the comparison image is equal to or less than a designated positional deviation amount; and operating the sample stage based on to the positional deviation amount between the reference image and the comparison image to move the visual field from the third visual field to a fourth visual field when a determination is made that the positional deviation amount between the reference image and the comparison image is not equal to or less than the designated positional deviation amount.

The charged particle beam device allows the visual field to be moved accurately to a target visual field using the sample stage.

According to an embodiment of the invention, there is provided a method for controlling a sample stage in a charged particle beam device including a deflector which deflects a charged particle beam, the sample stage which moves a sample, and a detector used for capturing a sample image, the method including:

obtaining movement information for moving a visual field of the deflector;

operating the deflector based on the movement information to move the visual field from a first visual field to a second visual field;

capturing the sample image with the second visual field to obtain a reference image;

operating the deflector to move the visual field from the second visual field to the first visual field;

operating the sample stage based on the movement information to move the visual field from the first visual filed to a third visual field;

capturing the sample image with the third visual field to obtain a comparison image;

calculating a positional deviation amount between the reference image and the comparison image;

determining whether the positional deviation amount between the reference image and the comparison image is equal to or less than a designated deviation amount; and operating the sample stage based on the positional deviation amount between the reference image and the comparison image to move the visual field from the third visual field to a fourth visual field when a determination is made that the positional deviation amount between the reference image and the comparison image is not equal to or less than the designated positional deviation amount.

According to the method for controlling a sample stage, the visual field can be moved accurately to a target visual field using the sample stage.

Preferred embodiments of the invention are described in detail below with reference to the drawings. It is noted that the following embodiments do not unduly limit the scope of the invention as stated in the claims. In addition, all of the components described in the following embodiments are not necessarily essential requirements of the invention.

In the following, a transmission electron microscope used to observe a sample by irradiating the sample with an electron beam will be described as an example of a charged particle beam device according to the invention, while the charged particle beam device according to the invention may be a device used to observe a sample by irradiating the sample with a charged particle beam (such as an ion beam) other the electron beam.

1. Transmission Electron Microscope

A transmission electron microscope according to an embodiment of the invention will be described with reference to the drawings. FIG. 1 is a diagram illustrating a configuration of a transmission electron microscope 100 according to the present embodiment.

The transmission electron microscope 100 irradiates a sample S with an electron beam, so that electrons transmitted through the sample S form an image, and a transmission electron microscopic image (sample image) of the sample S can be obtained.

As illustrated in FIG. 1, the transmission electron microscope 100 includes an electron gun 10, an irradiation lens 11, a deflector 12, a sample stage 14, a sample holder 15, an objective lens 16, an intermediate lens 17, a projection lens 18, a detector 20, a deflector control device 30, a sample stage control device 32, and a control device 40 (an example of a control unit).

The electron gun 10 emits an electron beam (an example of a charged particle beam). The electron gun 10 for example accelerates electrons released from the cathode by the anode and emits an electron beam.

The irradiation lens 11 focuses the electron beam released from the electron gun 10 and irradiates the sample S with the beam.

The deflector 12 deflects the electron beam directed upon the sample S. The deflector 12 may deflect the electron beam with a magnetic field or with an electric field. When the electron beam directed upon the sample S is deflected with the deflector 12, the visual field of the deflector 12 can be moved. In this way, the transmission electron microscope 100 has the function of image shifting to move the visual field by electromagnetically deflecting the electron beam directed upon the sample S.

The sample stage 14 holds the sample S through the sample holder 15. The sample stage 14 has a moving mechanism for moving the sample S in the horizontal direction. When the sample S is moved horizontally using the sample stage 14, the visual field can be moved. The sample stage 14 is for example driven by a motor, a piezoelectric element, or a combination thereof to move the sample S.

The objective lens 16 is the first stage lens which forms a sample image with the electron beam transmitted through the sample S. The objective lens 16, the intermediate lens 17, and the projection lens 18 constitute an imaging lens system, and the imaging lens system forms a sample image on the detector 20 with the electron beam transmitted through the sample S.

The detector 20 captures the sample image formed by the imaging lens system. The detector 20 is for example a digital camera such as a CCD (Charge Coupled Device) camera. The image data on the sample image captured by the detector 20 is output to the control device 40.

The deflector control device 30 controls the deflector 12. For example, the deflector control device 30 operates the deflector 12 in response to a control signal output from the control device 40.

The sample stage control device 32 controls the sample stage 14. For example, the sample stage control device 32 operates the sample stage 14 in response to a control signal output from the control device 40.

The control device 40 controls various parts of the transmission electron microscope 100. The control device 40 controls the sample stage 14 to move the visual field, which will be described in "2. Processing." The control device 40 includes a processing unit 42, an operating unit 44, a display unit 46, and a storage unit 48.

The operating unit 44 converts an instruction from the user into a signal and sends the signal to the processing unit 42. The operating unit 44 can be implemented for example, by an input device such as buttons, keys, a touch panel type display, and a microphone. The user can input movement information about the visual field and an instruction to change the magnification through the operating unit 44.

The display unit 46 displays the image generated by the processing unit 42. The function of the display unit 46 can be implemented for example by an LCD (liquid crystal display), a CRT (cathode ray tube), or a touch panel which also functions as the operating unit 44.

The storage unit 48 stores programs and data for the processing unit 42 to perform various kinds of calculation and control processing. The storage unit 48 is also used as a work area for the processing unit 42. The storage unit 48 can be implemented, for example, by a RAM (Random Access Memory), a ROM (Read Only Memory), and a hard disk.

The function of the processing unit 42 can be implemented by executing a program by hardware such as processing units (a CPU (Central Processing Unit) and a DSP (Digital Signal Processor)). The processing unit 42 includes a movement information obtaining unit 420, an image obtaining unit 422, a deflector control unit 424, a sample stage control unit 426, and a positional deviation amount calculating unit 428.

The movement information obtaining unit 420 obtains movement information for moving the visual field.

The image obtaining unit 422 obtains a sample image. The image obtaining unit 422 causes the detector 20 to capture the sample image. When the sample image is captured by the detector 20, the sample image (image data) is sent to the control device 40. The image obtaining unit 422 obtains the sample image (image data) output from the detector 20.

The deflector control unit 424 controls the deflector 12. For example, the deflector control unit 424 generates a control signal for operating the deflector 12 and sends the signal to the deflector control device 30. In this way, the deflector 12 can be controlled.

The sample stage control unit 426 controls the sample stage 14. For example, the sample stage control unit 426 generates a control signal to operate the sample stage 14 and sends the signal to the sample stage control device 32. In this way, the sample stage 14 can be controlled.

The positional deviation amount calculating unit 428 calculates the positional deviation amount between two images. The positional deviation amount between the two images can be calculated using a known method such as pattern matching.

The processing by the processing unit 42 will be described in detail in the following "2. Processing."

2. Processing

Figure 2:
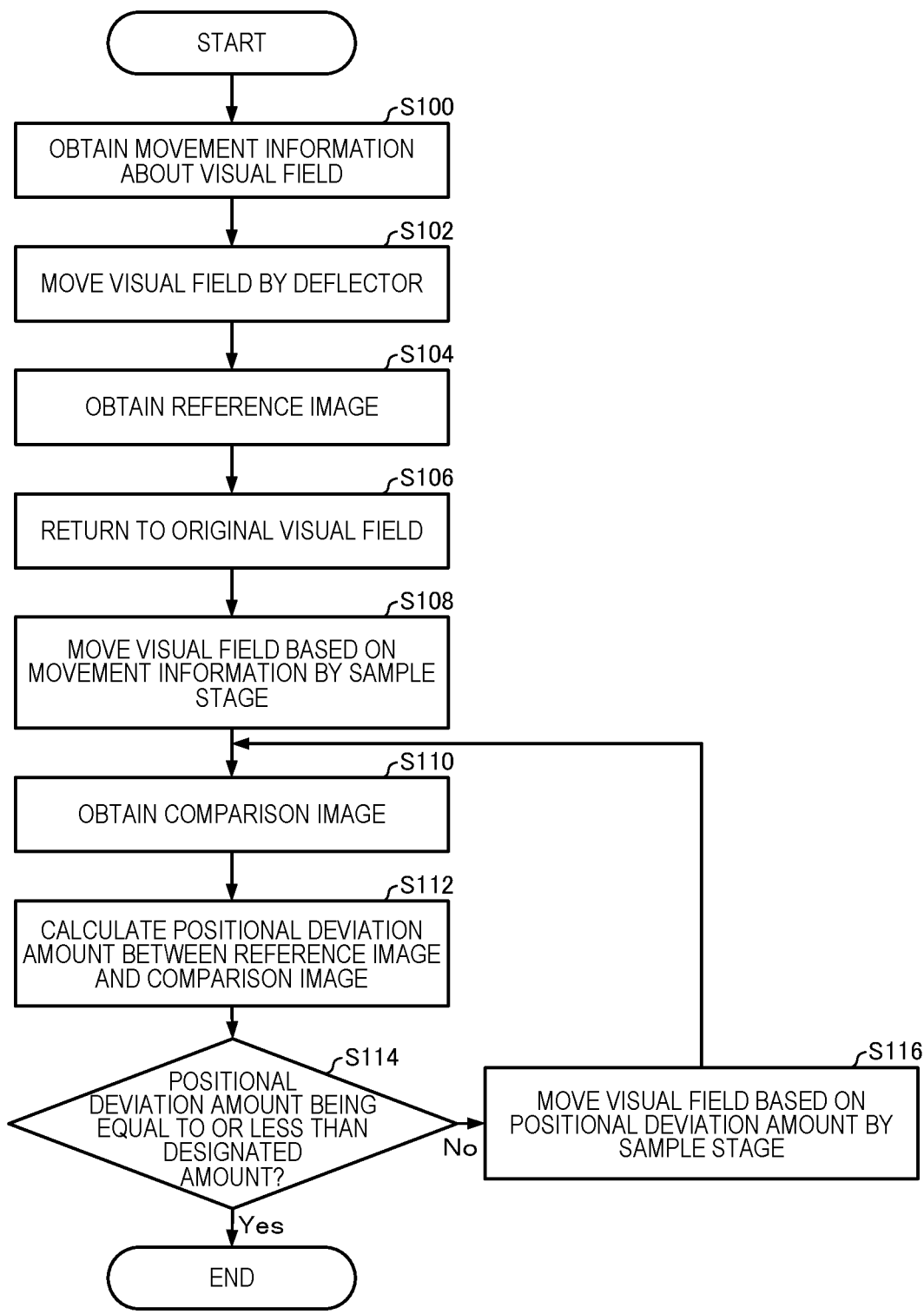
FIG. 2 is a flowchart illustrating an example of processing for controlling a sample stage by a processing unit.

In the transmission electron microscope 100, the visual field of the deflector 12 can be moved accurately using the sample stage 14. FIG. 2 is a flowchart illustrating an example of the processing for controlling the sample stage 14 by the processing unit 42.

When the user inputs movement information for moving the visual field through the operating unit 44, the movement information obtaining unit 420 receives the input movement information and obtains the movement information (S100).

Figure 3:
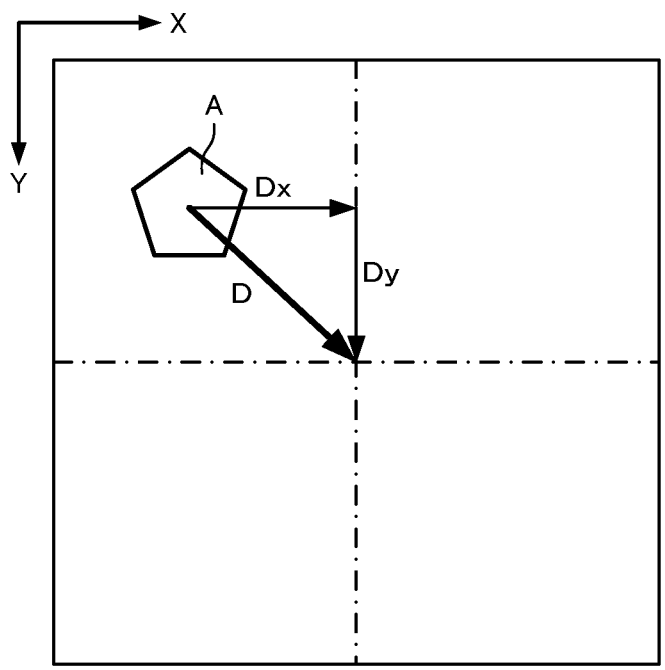
FIG. 3 is a diagram for explaining movement information.

FIG. 3 is a diagram for explaining the movement information. FIG. 3 illustrates a first visual field. The first visual field is a visual field at the start of the processing for moving the visual field.

The movement amount D of the visual field is represented for example as a movement amount Dx in the X direction and a movement amount Dy in the Y direction, where the X direction in FIG. 3 corresponds to the direction in which the sample holder 15 is inserted, and the direction orthogonal to the X direction is the Y direction.

In this example, the observation target A is moved to the center of the visual field. When the user inputs the movement amount Dx in the X direction and the movement amount Dy in the Y direction through the operating unit 44, the movement information obtaining unit 420 obtains the movement amount Dx and the movement amount Dy as movement information for moving the observation target A to the center of the visual field.

The deflector control unit 424 operates the deflector 12 based on the movement amount Dx and the movement amount Dy, so that the visual field is moved from the first visual field to the second visual field (S102).

Figure 4:
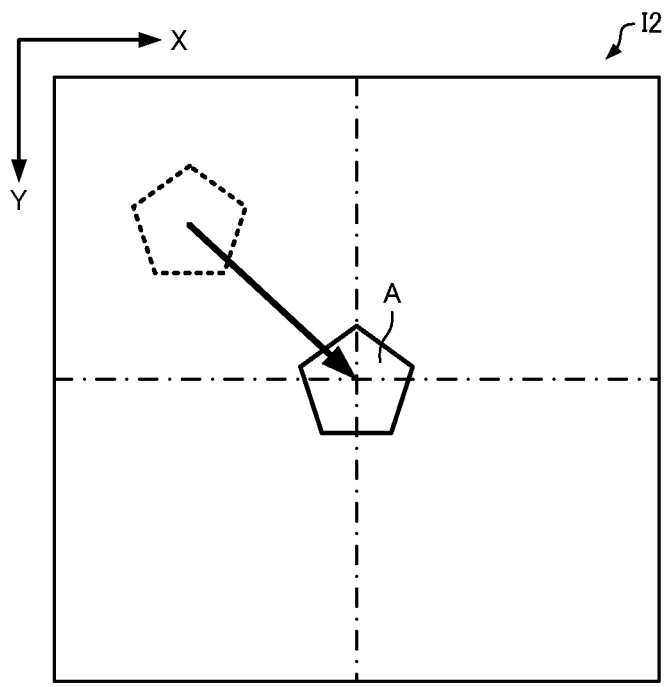
FIG. 4 is a diagram schematically illustrating a sample image captured with a second visual field.

FIG. 4 is a diagram schematically illustrating a sample image captured with the second visual field.

The deflector control unit 424 operates the deflector 12 based on the movement amount Dx and the movement amount Dy. As a result, the electron beam is deflected, and the visual field is moved by the movement amount Dx in the X direction and by the movement amount Dy in the Y direction. As a result, the visual field is changed from the first visual field to the second visual field.

When the visual field is moved using the deflector 12, the visual field is moved electromagnetically, and therefore the visual field is moved to the target visual field with high accuracy. Since the electron beam is deflected by the deflector 12, the path of the electron beam is deviated from the optical axis.

The image obtaining unit 422 captures the sample image with the second visual field in FIG. 4 to obtain a reference image I2 (S104). The image obtaining unit 422 causes the detector 20 to capture the sample image with the second visual field, i.e., the reference image I2. In the reference image I2, the observation target A is located in the center of the image.

The deflector control unit 424 operates the deflector 12 to return the visual field from the second visual field in FIG. 4 to the first visual field in FIG. 3 (S106). This resets the operation of the deflector 12. As a result, the path of the electron beam is aligned with the optical axis.

The sample stage control unit 426 operates the sample stage 14 based on the movement amount Dx and movement amount Dy to move the visual field from the first visual field to a third visual field (S108).

Figure 5:
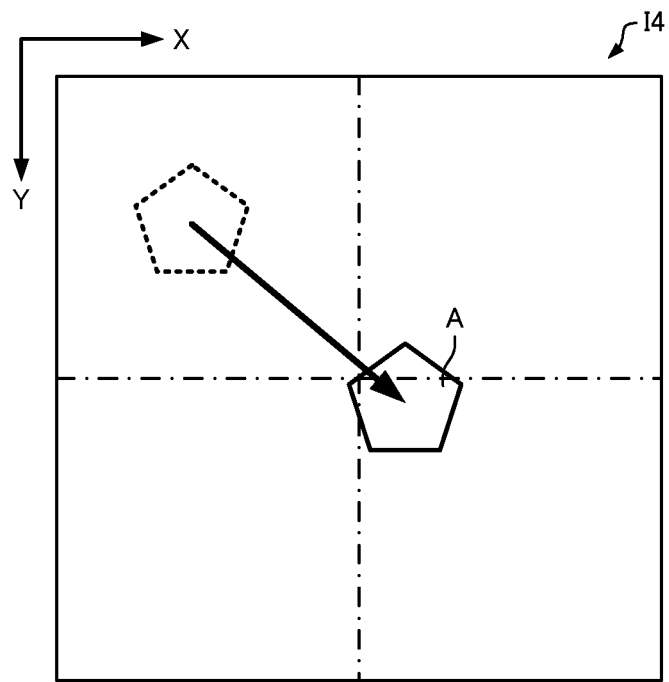
FIG. 5 is a diagram schematically illustrating a sample image captured with a third visual field.

FIG. 5 schematically illustrates the sample image captured with the third visual field.

The sample stage control unit 426 operates the sample stage 14 based on the movement amount Dx and the movement amount Dy. This causes the sample S to move, and ideally, the visual field is moved by the movement amount Dx in the X direction and by the movement amount Dy in the Y direction.

Here, when the visual field is moved using the sample stage 14, the visual field is moved mechanically, and therefore the visual field cannot be moved to a desired visual field with high accuracy. Therefore, with the third visual field, the observation target A is deviated from the center of the image.

The image obtaining unit 422 captures the sample image with the third visual field in FIG. 5 to obtain a comparison image I4 (S110). In the comparison image I4, the observation target A deviates from the center of the image.

The positional deviation amount calculating unit 428 calculates the positional deviation amount between the reference image I2 and the comparison image I4 (S112).

Figure 6:
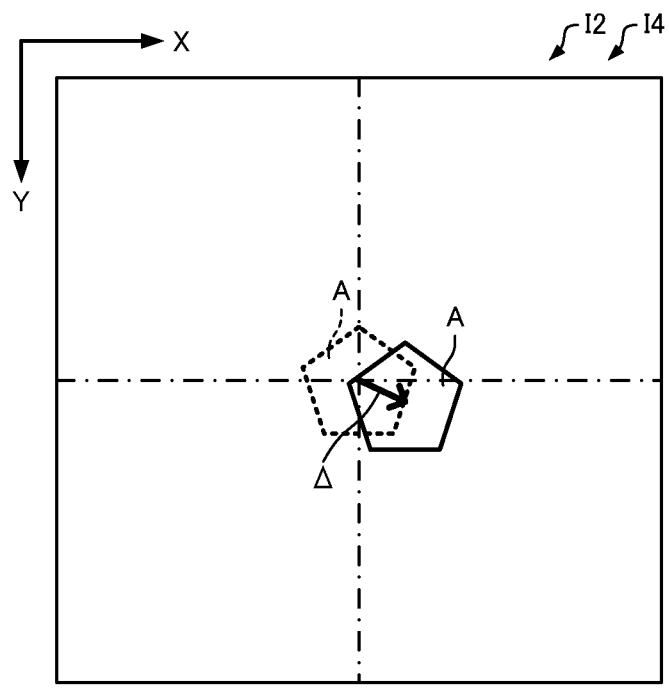
FIG. 6 is a diagram for explaining processing for calculating a positional deviation amount between a reference image and a comparison image.

FIG. 6 is a diagram for explaining the processing for calculating the positional deviation amount Δ between the reference image I2 and the comparison image I4. The positional deviation amount Δ can be calculated for example by pattern-matching the reference image I2 and the comparison image I4.

The positional deviation amount calculating unit 428 determines whether the positional deviation amount Δ is equal to or less than a previously designated positional deviation amount (designated amount) (S114).

When it is determined that the positional deviation amount Δ is not equal to or less than the designated amount or greater than the designated amount (No in S114), the sample stage control unit 426 operates the sample stage 14 based on the positional deviation amount Δ calculated in step S112 to move the visual field from the third visual field to a fourth visual field (S116). In other words, the sample stage control unit 426 operates the sample stage 14 to move the visual field so that the positional deviation amount Δ becomes zero.

Here, the positional deviation amount Δ can be expressed by the positional deviation amount ΔX in the X direction and the positional deviation amount ΔY in the Y direction. Therefore, by operating the sample stage 14 so that the positional deviation amount ΔX in the X direction and ΔY in the Y direction are zero, the positional deviation amount Δ can be approximated to zero.

The positional deviation amount Δ may be the magnitude of a vector indicating the positional deviation amount between the reference image I2 and the comparison image I4. In other words, the positional deviation amount between the reference image I2 and the comparison image I4 may be represented by the positional deviation amount Δ and the direction of the positional deviation, and the sample stage 14 may be operated so that the positional deviation amount Δ becomes zero.

Figure 7:
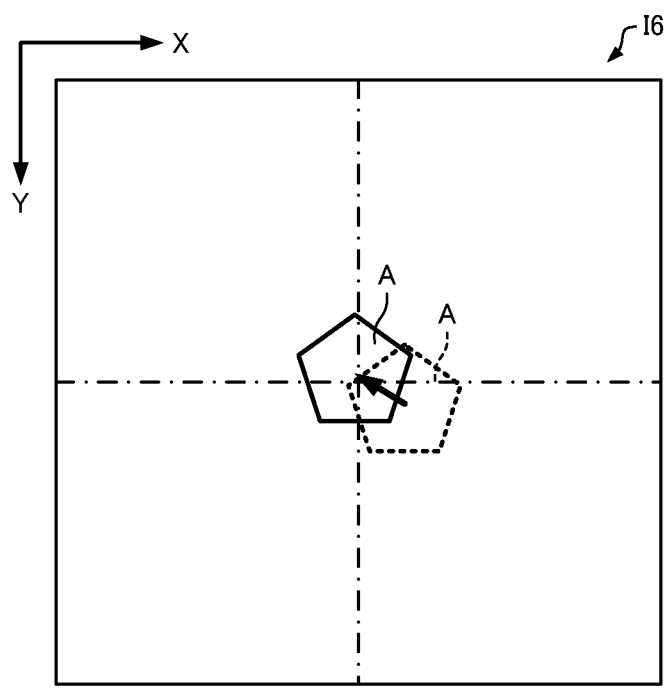
FIG. 7 is a diagram schematically illustrating a sample image captured with a fourth visual field.

FIG. 7 is a diagram schematically illustrating the sample image captured with a fourth visual field.

The sample stage control unit 426 operates the sample stage 14 based on the positional deviation amount Δ. As a result, the sample S is moved and the visual field is changed to the fourth visual field. Then, the process returns to S110, the image obtaining unit 422 captures the sample image with the fourth visual field in FIG. 7 to obtain a comparison image I6 (S110). The positional deviation amount calculating unit 428 calculates the positional deviation amount Δ between the reference image I2 and the comparison image I6 (S112) and determines whether the positional deviation amount Δ is equal to or less than the designated amount (S114).

In this way, the processing steps S110, S112, S114, and S116 are repeated until the positional deviation amount Δ is equal to or less than the designated amount.

When it is determined that the positional deviation amount is equal to or less than the designated amount (Yes in S114), the processing unit 42 ends the processing. Through the above-described processing, the visual field can be moved accurately using the sample stage 14, and the observation target A can be arranged in the center of the image.

3. Functions and Effects

In the transmission electron microscope 100, the processing unit 42 performs the processing steps of obtaining movement information for moving the visual field, operating the deflector based on the movement information to move the visual field from the first visual field to the second visual field, capturing the sample image with the second visual field to obtain the reference image I2, and operating the deflector 12 to move the visual field from the second visual field to the first visual field, operating the sample stage 14 based on the movement information to move the visual field from the first visual field to the third visual field, capturing the sample image with the third visual field to obtain the comparison image I4, calculating the positional deviation amount Δ between the reference image I2 and the comparison image I4, determining whether the positional deviation amount Δ between the reference image I2 and the comparison image I4 is equal to or less than the designated amount, and operating the sample stage 14 based on the positional deviation amount between the reference image I2 and the comparison image I4 to move the visual field from the third visual field to the fourth visual field when a determination is made that the positional deviation amount between the reference image and the comparison image is not equal to or less than the designated amount.

Therefore, the transmission electron microscope 100 allows the visual field to be moved to a desired visual field highly accurately using the sample stage 14.

In the transmission electron microscope 100, the processing unit 42 performs the processing for capturing the sample image with the fourth visual field to obtain the comparison image I6 after the processing for moving the visual field to the fourth visual field. Therefore, the transmission electron microscope 100 can reduce the positional deviation of the visual field using the sample stage 14 to an amount equal to or less than the designated amount.

The method for controlling the sample stage 14 in the transmission electron microscope 100 includes the steps of obtaining movement information for moving the visual field, operating the deflector 12 based on the movement information to move the visual field from the first visual field to the second visual field, capturing the sample image with the second visual field to obtain the reference image I2, operating the deflector 12 to move the visual field from the second visual field to the first visual field, operating the sample stage 14 based on the movement information to move the visual field from the first visual field to the third visual field, capturing the sample image with the third visual field to obtain the comparison image I4, calculating the positional deviation amount between the reference image I2 and the comparison image I4, determining whether the positional deviation amount Δ between the reference image I2 and the comparison image I4 is equal to or less than a designated amount, and operating the sample stage 14 based on the positional deviation amount between the reference image I2 and the comparison image I4 to move the visual field from the third visual field to the fourth visual field when a determination is made that the positional deviation amount between the reference image I2 and the comparison image I4 is not equal to or less than the designated amount.

Therefore, the method for controlling the sample stage 14 in the transmission electron microscope 100 allows the visual field to be moved to a target visual field highly accurately using the sample stage 14.

4. Modifications

The invention is not limited to the embodiments described above, and various modifications can be implemented within the scope and gist of the invention.

4.1 First Modification

According to the above-described embodiments, in step S100 for obtaining movement information in FIG. 2, the movement information obtaining unit 420 obtains movement information input by the user through the operating unit 44. However, step S100 for obtaining the movement information is not limited the above.

Figure 8:
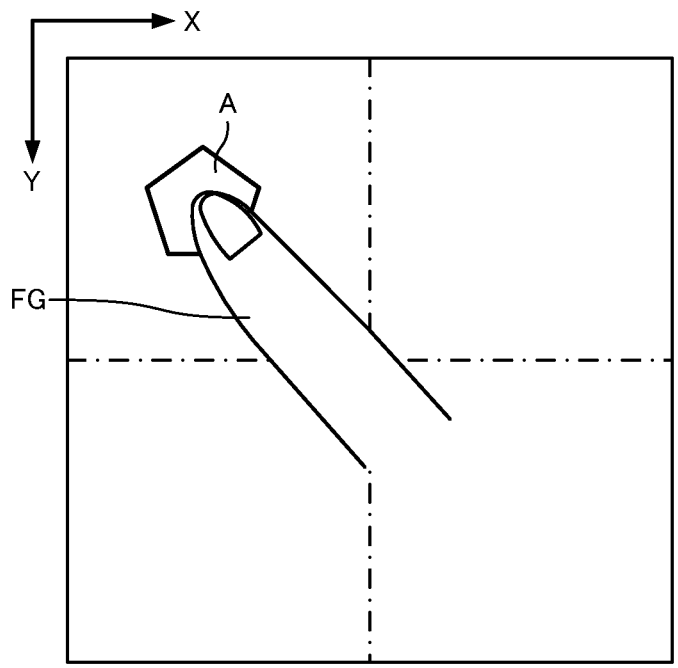
FIG. 8 is a diagram for explaining a modification of processing for obtaining movement information.

FIG. 8 is a diagram for explaining a modification of the processing for obtaining the movement information.

As illustrated in FIG. 8, when the user performs operation to designate an observation target A using pointing means (an example of the operating unit 44) such as a mouse and a touch panel in the sample image displayed on the display unit 46, the movement information obtaining unit 420 obtains positional information about the designated observation target A.

The operation for designating the observation target A is performed for example as the user touches the fingertip FG to the position of the observation target A at the sample image displayed on the touch panel (contacting operation) as illustrated in FIG. 8. The operation for designating the observation target A is not limited to the above and may be touching operation with a touch pen or mouse clicking operation with a mouse pointer moved on the observation target A.

The movement information obtaining unit 420 compares the position of the designated observation target A with the position of the center of the image, calculates the positional deviation amount, and generates movement information.

When the processing for controlling the sample stage 14 in FIG. 2 is performed using the movement information thus obtained, the observation target A designated by the user can be moved to the center of the image highly accurately.

4.2. Second Modification

According to the above-described embodiment, in the step S100 of obtaining movement information in FIG. 2, the movement information obtaining unit 420 obtains the movement information input by the user through the operating unit 44 while the step S100 of obtaining the movement information is not limited to the above.

According to a second modification, the control device 40 extracts a part of a sample image having a high degree of similarity to a template image, and the visual field is moved so that the extracted part is in the center of the image.

Figure 9:
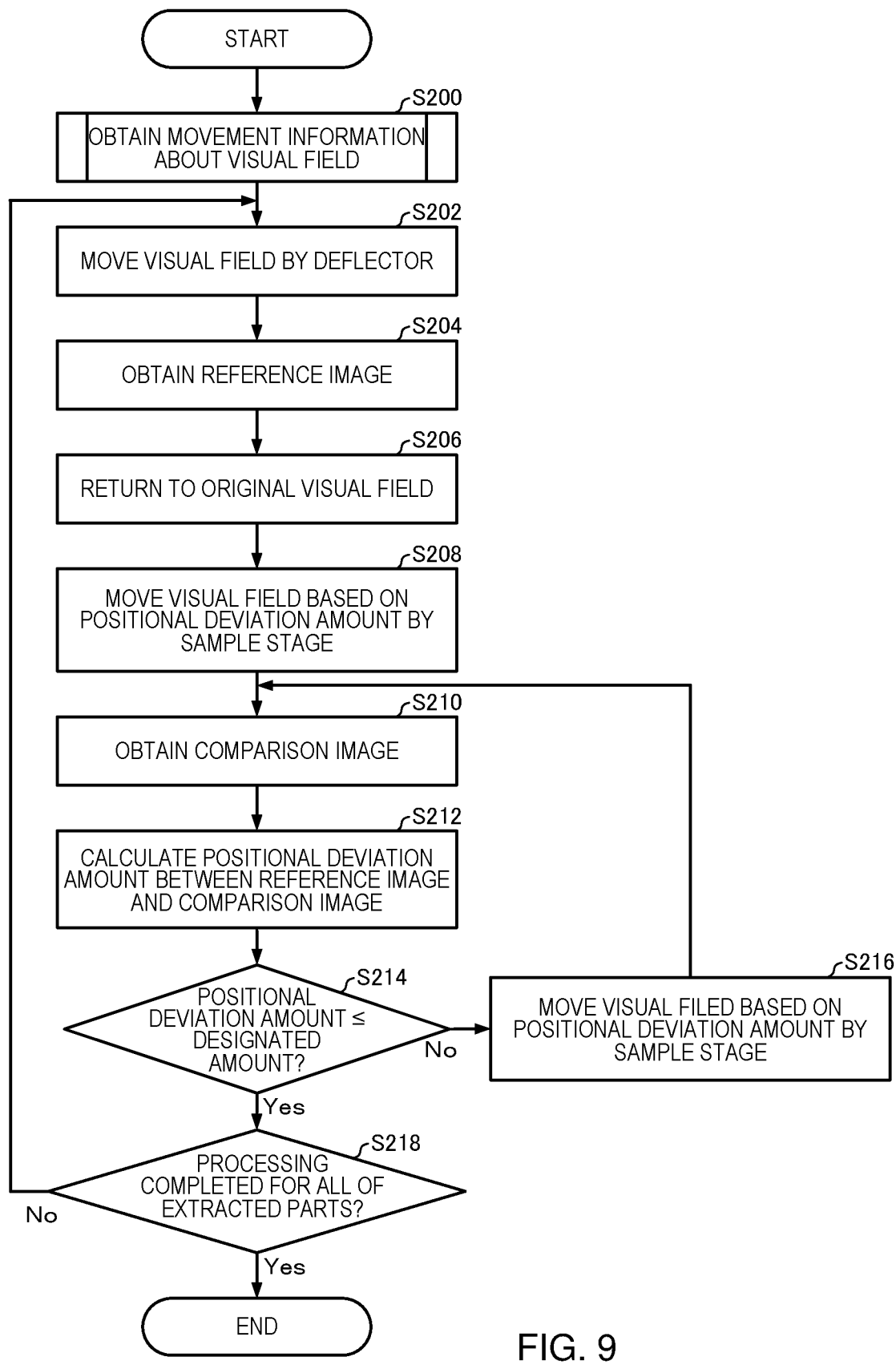
FIG. 9 is a flowchart illustrating a modification of processing for controlling a sample stage by a processing unit.
Figure 10:
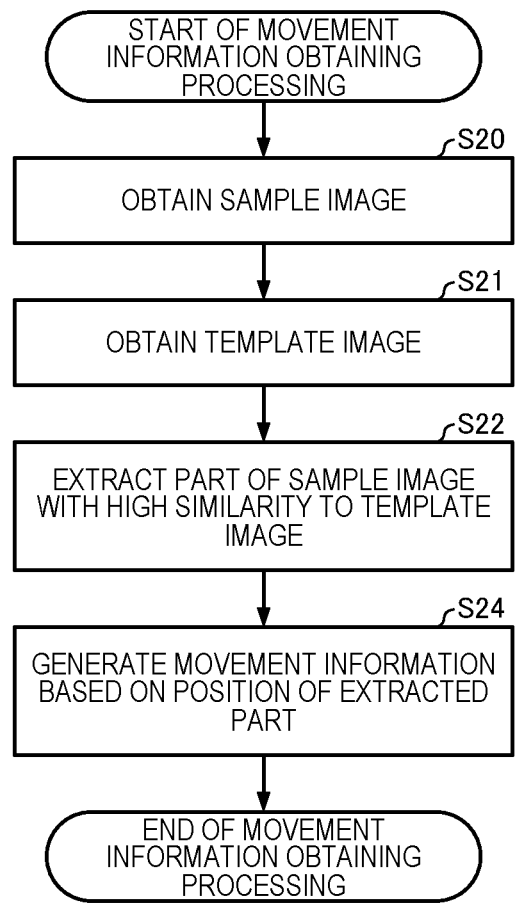
FIG. 10 is a flowchart illustrating a modification of processing for obtaining movement information.

FIG. 9 is a flowchart illustrating a modification of the processing for controlling the sample stage 14 in the processing unit 42. FIG. 10 is a flowchart illustrating a modification of the processing for obtaining movement information.

First, the processing unit 42 obtains movement information about a visual field (S200).

Specifically, as illustrated in FIG. 10, the image obtaining unit 422 obtains a sample image with a visual field designated by the user (S20).

Figure 11:
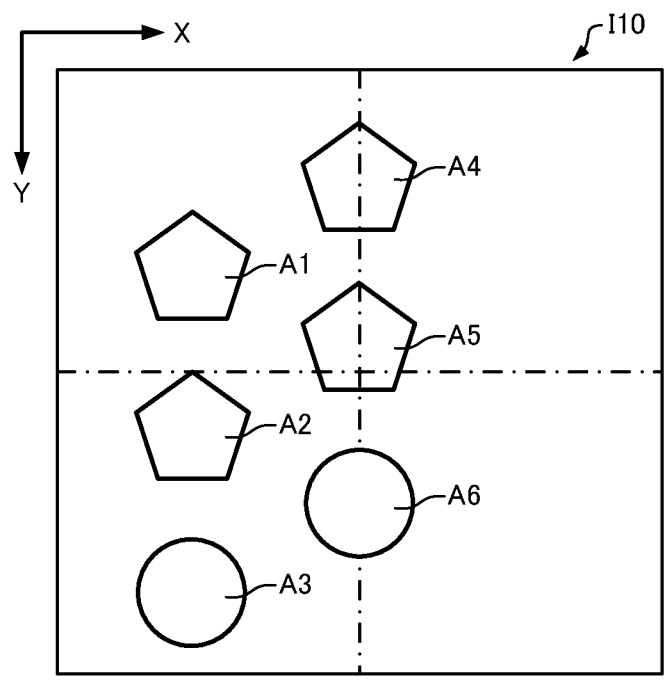
FIG. 11 is a diagram for explaining a modification of processing for obtaining movement information.

FIG. 11 illustrates a sample image I10 obtained with the visual field designated by the user. As illustrated in FIG. 11, the sample image I10 includes patterns A1, A2, A3, A4, A5, and A6.

Then, the image obtaining unit 422 obtains a template image (S21).

Figure 12:
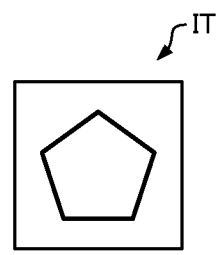
FIG. 12 is a diagram for explaining a modification of processing for obtaining movement information.

FIG. 12 illustrates the template image IT. The template image IT is for example an image with a pattern to be an observation target. The template image IT is stored for example in the storage unit 48 in advance.

Then, the movement information obtaining unit 420 compares the sample image I10 and the template image IT and extracts the part of the sample image I10 which has a high degree of similarity to the template image IT (S22). Such a part with a high degree of similarity is extracted for example by template matching. The degree of similarity can be changed as appropriate.

In the sample image I10 in FIG. 11, patterns A1, A2, A4, and A5 are extracted as the parts each having a high degree of similarity to the template image IT.

Then, the movement information obtaining unit 420 obtains positional information about the extracted parts with high degrees of similarity and generates movement information based on the positional information about the parts with high degrees of similarity (S24). Here, the movement information is information for moving such a part with a high degree of similarity to the center of the image.

In the processing, movement information for moving the pattern A1 to the center of the image, movement information for moving the pattern A2 to the center of the image, movement information for the moving pattern A4 to the center of the image, and movement information for moving the pattern A5 to the center of the image are generated.

Next, the processing unit 42 performs the processing for controlling the sample stage 14 for moving the pattern A1 to the center of the image. Specifically, processing steps S202, S204, S206, S208, S210, S212, S214, and S216 are performed using the movement information about pattern A1. Processing steps S202, S204, S206, S208, S210, S212, S214, and S216 are the same as processing steps S102, S104, S106, S108, S110, S112, S114, and S116 in FIG. 2, respectively, and a description thereof will not be provided.

In the processing for controlling the sample stage 14 to move the pattern A1 to the center of the image, when it is determined that the positional deviation amount is equal to or less than a designated amount (Yes in S214), the movement information obtaining unit 420 determines whether the processing has completed for all of the extracted parts (S218).

Upon determining that the processing has not completed for all the extracted parts (No in S218), the movement information obtaining unit 420 performs the processing for moving the visual field using the movement information about the pattern A2. Specifically, processing steps S202, S204, S206, S208, S210, S212, S214, and S216 are performed using the movement information about pattern A2.

In this way, processing steps S202, S204, S206, S208, S210, S212, S214, S216, and S218 are repeated until the processing for controlling the sample stage 14 is performed for all of the extracted parts or the patterns A1, A2, A4, and A5.

When it is determined that the processing has been completed for all of the extracted parts (Yes in S218), the processing unit 42 ends the processing.

According to the second modification, parts with high degrees of similarity to the template image can be automatically extracted from the sample image, and the visual field can be moved so that the extracted parts are positioned in the center of the image.

4.3. Third Modification

According to the above-described embodiments, in the step S100 of obtaining the movement information in FIG. 2, the movement information obtaining unit 420 obtains the movement information input by the user through the operating unit 44, but the step S100 of obtaining the movement information is not limited the above.

In the transmission electron microscope 100, the magnification of the sample image can be changed using an optical system (such as an objective lens 16).

Figure 13:
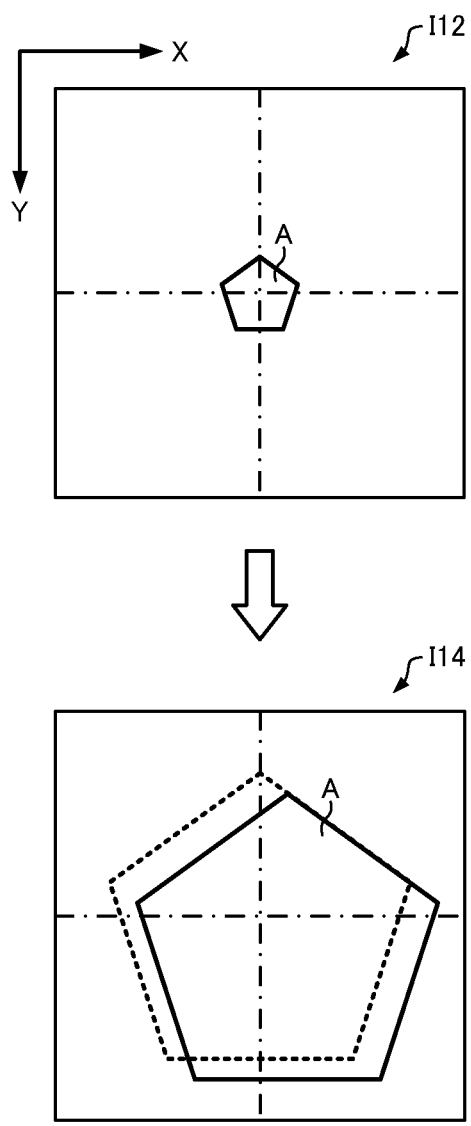
FIG. 13 is a diagram illustrating change of magnification of a sample image.

FIG. 13 illustrates change of magnification of the sample image. The image I12 in FIG. 13 is the sample image before enlargement, and the image 114 is the sample image after enlargement.

When the sample image is enlarged using the optical system, the image is enlarged with the center of the image as the enlargement center. When the sample image is enlarged using the optical system, however, the center of the image may not match the enlargement center, and the visual field may be deviated between the image I12 before enlargement and the image 114 after enlargement. In the example in FIG. 13, even though the image has been enlarged by setting the observation target A to the center of image I12, the observation target A is not located in the center of the enlarged image 114.

According to the third modification, the visual field is moved using the sample stage 14 so that the observation target A is positioned in the center of the image in the image after enlargement. According to the third modification, the step S100 of obtaining the movement information in FIG. 2 is different.

Figure 14:
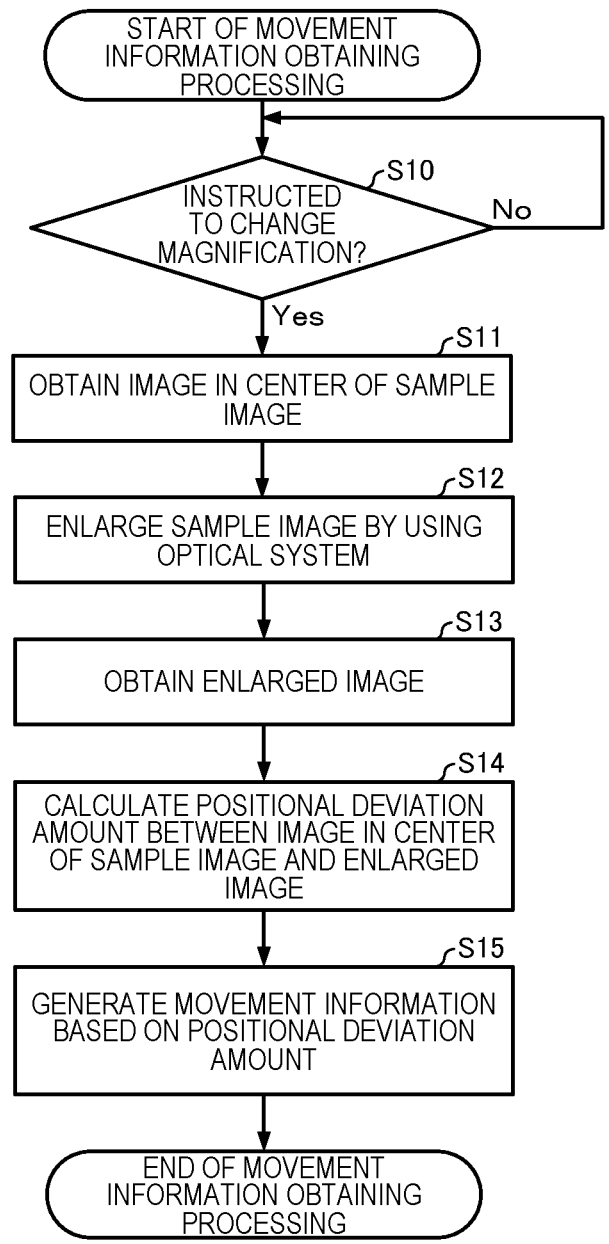
FIG. 14 is a flowchart illustrating a modification of processing for obtaining movement information.

FIG. 14 is a flowchart illustrating a modification of processing for obtaining the movement information.

First, the processing unit 42 determines whether there has been an instruction to change the magnification of the sample image (a magnification change instruction) (S10). For example, it is determined that there has been an instruction to change the magnification when the user has operated the operating unit 44 to input a magnification. The processing unit 42 stands by until instructed to change the magnification (No in S10).

When it is determined that there has been a magnification change instruction (Yes in S10), the image obtaining unit 422 obtains an image I20 (see FIG. 15) in the center of the sample image (S11). In the following description, it is assumed that an instruction to enlarge a TEM image by four times has been received as a magnification change instruction.

Figure 15:
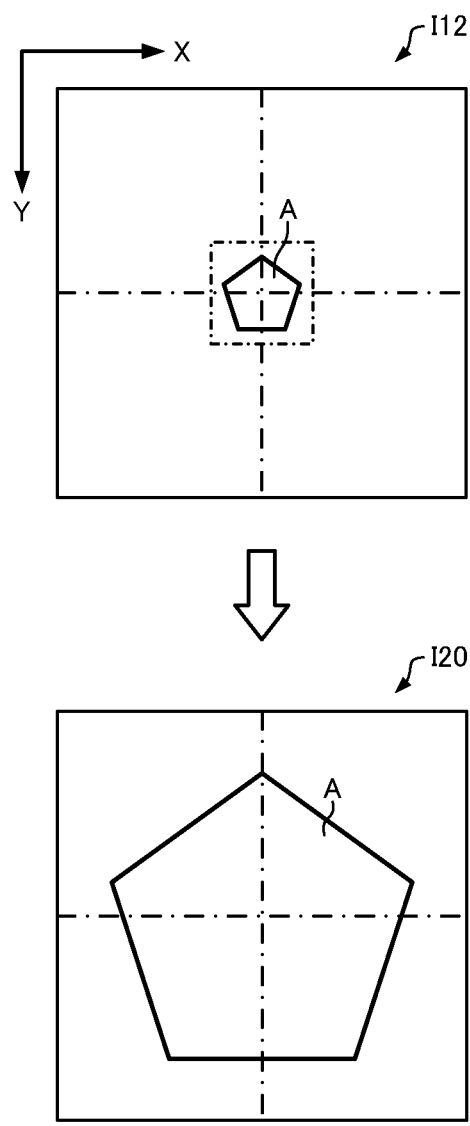
FIG. 15 is a diagram for explaining processing for obtaining an image in the center of a sample image.

FIG. 15 a diagram for explaining the processing for obtaining the image I20 in the center of the sample image.

When the magnification change instruction is input, the image obtaining unit 422 captures the sample image with a visual field for changing the magnification and obtains the image I12. The image obtaining unit 422 then performs image processing to cut out the center part of the image I12 from the image I12 and generates the image I20 while the sample image is magnified by four times. As illustrated in FIG. 15, the image I20 is an image that has been enlarged four times by image processing as the center of the visual field of the image I12 is set as the enlargement center.

Then, the image obtaining unit 422 enlarges the sample image using the optical system (such as the objective lens 16) (S12). The image obtaining unit 422 captures the enlarged sample image and obtains an image I22 (see FIG. 16) (S13).

Figure 16:
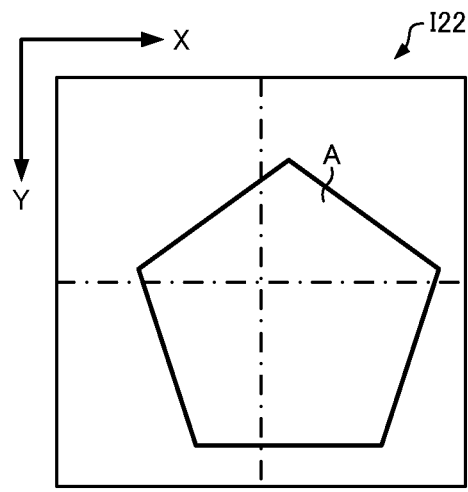
FIG. 16 is a diagram schematically illustrating an image enlarged by using an optical system.

FIG. 16 schematically illustrates the image I22 obtained by enlarging the sample image by using the optical system. As illustrated in FIG. 16, since the image I22 is an image enlarged using the optical system, the position of the center of the visual field of the image I22 is deviated from the position of the center of the visual field of image I12.

Figure 17:
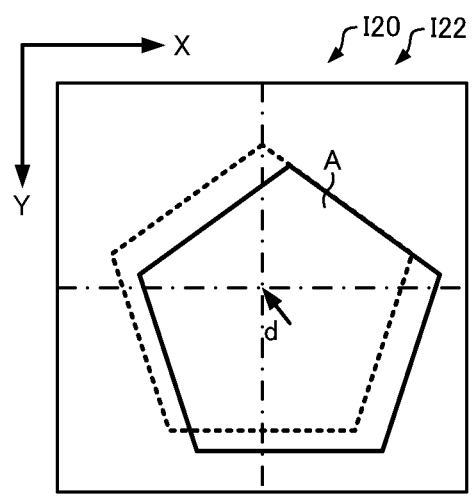
FIG. 17 is a diagram for explaining processing for calculating a positional deviation amount between images before and after enlargement.

Then, the movement information obtaining unit 420 calculates the positional deviation amount d between the image I20 in FIG. 15 and the image I22 in FIG. 16 (S14) as illustrated in FIG. 17 and generates movement information based on the positional deviation amount d (S15). The movement information is used to position the observation target A in the center of the image.

In this way, the movement information can be obtained. Using the movement information, the processing for controlling the sample stage 14 in FIG. 2 (steps S100 to S114) is performed. As a result, the positional deviation amount between the images before and after enlargement using the optical system can be corrected.

4.4. Fourth Modification

In the above description of the embodiments, the charged particle beam device according to the invention is a transmission electron microscope, while the charged particle beam device according to the invention is not limited to the transmission electron microscope. For example, the charged particle beam device according to the invention may be a scanning transmission electron microscope, a scanning electron microscope, an Auger electron spectrometer, and a focused ion beam system.

The above-described embodiments and modifications are examples and the invention is not limited thereto. For example, the embodiments and the modifications may be combined appropriately.

The invention is not limited to the above-described embodiments, and various modifications can be made. For example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A charged particle beam device irradiating a sample with a charged particle beam to obtain a sample image, the device comprising:
   a deflector which deflects the charged particle beam;
   a sample stage which moves the sample;
   a detector used for capturing the sample image; and
   a control unit which controls the deflector and the sample stage,
   the control unit configured to perform processing for:
   obtaining movement information for moving a visual field of the deflector;
   operating the deflector based on the movement information to move the visual field from a first visual field to a second visual field;
   capturing the sample image with the second visual field to obtain a reference image;
   operating the deflector to move the visual field from the second visual field to the first visual field;
   operating the sample stage based on the movement information to move the visual field from the first visual field to a third visual field;
   capturing the sample image with the third visual field to obtain a comparison image;
   calculating a positional deviation amount between the reference image and the comparison image;
   determining whether the positional deviation amount between the reference image and the comparison image is equal to or less than a designated positional deviation amount; and
   operating the sample stage based on the positional deviation amount between the reference image and the comparison image to move the visual field from the third visual field to a fourth visual field when a determination is made that the positional deviation amount between the reference image and the comparison image is not equal to or less than the designated positional deviation amount.

2. The charged particle beam device according to claim 1, further comprising an operating unit for inputting the movement information.

3. The charged particle beam device according to claim 1, wherein, in the processing for obtaining the movement information, the control unit is configured to perform processing for:
   obtaining the sample image;
   obtaining a template image;
   comparing the sample image and the template image to extract a part of the sample image, the part having a high degree of similarity to the template image, and
   obtaining positional information of the extracted part to generate the movement information based on the positional information of the extracted part.

4. The charged particle beam device according to claim 1, further comprising an optical system for enlarging the sample image, wherein
   in the processing for obtaining the movement information, the control unit is configured to perform processing for:
   obtaining an image in a center of the sample image when an instruction to enlarge the sample image is input;
   enlarging the sample image by using the optical system;
   calculating a positional deviation amount between the image in the center and the enlarged sample image; and
   generating the movement information based on the positional deviation amount between the image in the center and the enlarged sample image.

5. The charged particle beam device according to claim 1, wherein, after the processing for moving the visual field from the third visual field to the fourth visual field, the control unit is configured to perform processing for capturing the sample image with the fourth visual field to obtain the comparison image.

6. A method for controlling a sample stage in a charged particle beam device comprising a deflector which deflects a charged particle beam, the sample stage which moves a sample, and a detector used for capturing a sample image, the method comprising:
   obtaining movement information for moving a visual field of the deflector;
   operating the deflector based on the movement information to move the visual field from a first visual field to a second visual field;
   capturing the sample image with the second visual field to obtain a reference image;
   operating the deflector to move the visual field from the second visual field to the first visual field;
   operating the sample stage based on the movement information to move the visual field from the first visual filed to a third visual field;
   capturing the sample image with the third visual field to obtain a comparison image;
   calculating a positional deviation amount between the reference image and the comparison image;
   determining whether the positional deviation amount between the reference image and the comparison image is equal to or less than a designated deviation amount; and
   operating the sample stage based on the positional deviation amount between the reference image and the comparison image to move the visual field from the third visual field to a fourth visual field when a determination is made that the positional deviation amount between the reference image and the comparison image is not equal to or less than the designated positional deviation amount.

* * * * *